United States Patent
Shimomura et al.

(10) Patent No.: US 6,455,891 B2
(45) Date of Patent: Sep. 24, 2002

(54) SEMICONDUCTOR DEVICE AND METHOD FOR MANUFACTURING THE SAME

(75) Inventors: Narakazu Shimomura, Gojo (JP); Hiroyuki Teraoka, Ueno (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/795,318

(22) Filed: Mar. 1, 2001

(30) Foreign Application Priority Data

Apr. 14, 2000 (JP) ........................................ 2000-113784

(51) Int. Cl.⁷ ............................................ H01L 29/792
(52) U.S. Cl. ........................ 257/324; 257/321; 257/324; 257/637
(58) Field of Search ................................. 257/321, 324, 257/325, 635, 637, 639, 640, 641, 649; 427/307, 309; 438/192, 194, 261, 591, 592, 761, 789

(56) References Cited

U.S. PATENT DOCUMENTS

| | | | | |
|---|---|---|---|---|
| 5,712,194 A | * | 1/1998 | Kanazawa | 438/618 |
| 5,953,635 A | * | 9/1999 | Andideh | 438/624 |
| 5,976,626 A | * | 11/1999 | Matsubara et al. | 427/307 |
| 6,187,633 B1 | * | 2/2001 | Dong et al. | 438/261 |
| 6,191,445 B1 | * | 2/2001 | Fujiwara | 257/321 |
| 6,246,105 B1 | * | 6/2001 | Morozumi et al. | 257/637 |

FOREIGN PATENT DOCUMENTS

JP  5-41459  2/1993

* cited by examiner

Primary Examiner—Hoai Ho
Assistant Examiner—Dao Nguyen
(74) Attorney, Agent, or Firm—Nixon & Vanderhye P.C.

(57) ABSTRACT

A semiconductor device comprising: a first wiring layer formed on a semiconductor substrate with an insulation film interposed therebetween, an interlayer insulation film and a second wiring layer formed on the first wiring layer in this order, wherein the interlayer insulation film is composed, from a first wiring layer side, of a first silicon oxide film having a compressive stress within the film, a silicon nitride film having a compressive stress within the film, a second silicon oxide film having a tensile stress within the film, and a third silicon oxide film having a compressive stress within the film.

5 Claims, 2 Drawing Sheets

SEMICONDUCTOR DEVICE AND METHOD FOR MANUFACTURING THE SAME

CROSS-REFERENCE TO RELATED APPLICATION

This application is related to Japanese application No. Hei 12(2000)-113784 filed on Apr. 14, 2000, whose priority is claimed under 35 USC §119, the disclosure of which is incorporated by reference in its entirety.

BACKGROUND OF THE INVENTION

1. Field of the Invention

The present invention relates to a semiconductor device and a method for manufacturing the same, and more particularly to a structure of an interlayer insulation film for use in a semiconductor device having a miniature structure based on a design rule of a submicron order, and a method for fabricating the interlayer insulation film.

2. Description of Related Art

As semiconductor devices are becoming more and more highly integrated, there is an increasing demand for multi-layer interconnection. In formation of the multi-level interconnection, it is necessary to smoothly flatten an interlayer insulation film provided between two wiring layers in order that steps in a first wiring layer do not cause a break in a second wiring layer. To flatten the interlayer insulation film, there has been widely used a silicon oxide film formed by a coating and sintering method. The silicon oxide film thus formed involves the problem of generation of particles or cracks or the problem of diffusion of water contained in the film, which leads to deterioration of characteristics of transistors of a semiconductor device.

In recent years, a silicon oxide film (referred to as $TEOS/O_3$—$SiO_2$ film hereinafter) formed by an atmospheric CVD process using tetraethylorthosilicate (referred to as TEOS hereinafter) and ozone as materials is receiving attention as the interlayer insulation film and is becoming in practical use. The $TEOS/O_3$—$SiO_2$ film is advantageous in that it can be formed at a low temperature of 400° C. or lower and that it covers steps in a flow form already at its deposition.

However, the deposition rate of the $TEOS/O_3$—$SiO_2$ film is strongly dependent on an under layer, and tends to vary depending on a material and a configuration of the under layer. For example, the deposition rate of the $TEOS/O_3$—$SiO_2$ film is high when the film is deposited on a silicon substrate while the deposition rate is low when the film is deposited on an insulation film such as a $SiO_2$ film.

Further, the $TEOS/O_3$—$SiO_2$ film has a high content of water therein. Therefore, in the cases where the film was used as an interlayer insulation film for covering a MOS device, water in the film diffuses into the MOS device. As a result, hot carriers are generated at operation of the MOS device, and reduce the reliability of the device.

To solve this problem, there have been conceived various methods as disclosed, for example, in Japanese Unexamined Patent Publication Nos. Hei 5(1993)-41459 and Hei 7(1995)-335753. In these methods, a thin silicon nitride film is formed on a first wiring layer, and the $TEOS/O_3$—$SiO_2$ film is deposited thereon. Thus, the silicon nitride film is formed prior to the deposition of the $TEOS/O_3$—$SiO_2$ film, so that the dependence of the deposition rate of the $TEOS/O_3$—$SiO_2$ film on the under layer is controlled and water is blocked off, thereby ensuring reliability.

The above-mentioned methods can control the dependence of the deposition rate of the $TEOS/O_3$—$SiO_2$ film on the under layer. In the cases where the first wiring film is thick, however, water in the $TEOS/O_3$—$SiO_2$ film cannot be sufficiently blocked off, which sometimes reduced the reliability of the MOS device.

This inability of the $TEOS/O_3$—$SiO_2$ film to block off water is due to the fact that the silicon nitride film is too thin (20 nm in an example of Japanese Unexamined Patent Publication No. Hei 5(1991)-41459) to completely cover sidewalls (portions A in FIG. 2(*a*)) of the thick first wiring film. In FIGS. 2(*a*) and 2(*b*), numerals 1, 2 and 3 designate the first wiring film, the silicon nitride film and the TEOS/$O_3$—$SiO_2$ film, respectively.

To deal with the above situation, it is conceived to thicken the silicon nitride film (for example, around 100 nm or more) to completely cover the sidewalls. When the silicon nitride film is made thick, however, there arises a problem that the silicon nitride film comes off the first wiring layer or cracks occur in the silicon nitride film itself due to a stress within the film.

SUMMARY OF THE INVENTION

The object of the present invention is to control the dependence of the deposition rate of the $TEOS/O_3$—$SiO_2$ film on the under layer and prevent water contained in the $TEOS/O_3$—$SiO_2$ film from diffusing into the MOS device, thereby ensuring the high reliability of the MOS device.

Thus, the present invention provides a semiconductor device comprising: a first wiring layer formed on a semiconductor substrate with an insulation film interposed therebetween, an interlayer insulation film and a second wiring layer formed on the first wiring layer in this order, wherein the interlayer insulation film is composed, from a first wiring layer side, of a first silicon oxide film having a compressive stress within the film, a silicon nitride film having a compressive stress within the film, a second silicon oxide film having a tensile stress within the film, and a third silicon oxide film having a compressive stress within the film.

Further, the present invention a method for manufacturing a semiconductor device comprising the steps of: forming a first wiring layer on a semiconductor substrate with an insulation film interposed therebetween, forming on the first wiring layer a first silicon oxide film having a compressive stress within the film and a silicon nitride film having a compressive stress within the film in this order, forming on the silicon nitride film a second silicon oxide film having a tensile stress within the film, forming on the second silicon oxide film a third silicon oxide film having a compressive stress within the film, and forming a second wiring layer on the third silicon oxide film.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1A:
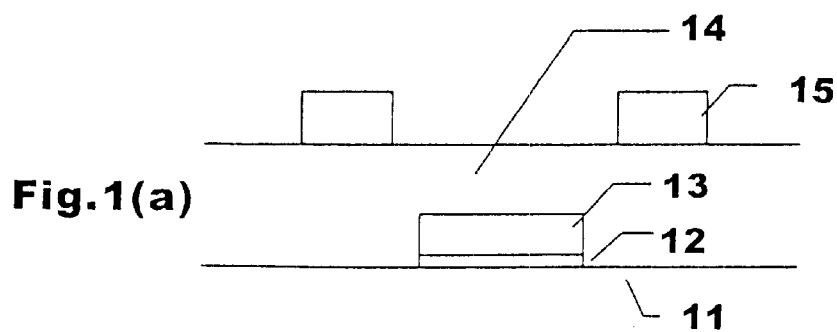
FIGS. 1(*a*) to 1(*d*) are schematic sectional views showing processes in the method for manufacturing a semiconductor device of the present invention.

The semiconductor substrate usable in the present invention is not particularly limited, but a silicon substrate is preferred. The substrate may have an n-type or p-type conductivity. An example of impurities rendering the substrate p-type conductive is boron, and examples of impurities rendering the substrate n-type conductive are phosphorus and arsenic. Source/drain regions or a device such as a MOS device may be formed in the substrate beforehand.

A first wiring layer is formed on the semiconductor substrate with an insulation film interposed therebetween. Examples of the first wiring layer include a gate electrode with a gate insulation film interposed between the gate electrode and the semiconductor substrate and a wiring layer with an interlayer insulation layer interposed between the wiring layer and the semiconductor substrate.

In the cases where the first wiring layer is the gate electrode, the gate insulation film may be a silicon oxide film or the like having a thickness of 0.005 $\mu$m to 0.03 $\mu$m, and the gate electrode may be a polysilicon film, a tungsten polycide film or the like having a thickness of 0.05 $\mu$m to 0.3 $\mu$m and having impurities diffused at a high concentration. However, the first wiring layer is not limited to the above-mentioned structure, but known materials may be used in accordance with various applications.

In the cases where the first wiring layer is the wiring layer formed on the interlayer insulation layer, the interlayer insulation layer preferably has a thickness of 500 nm to 1000 nm and the wiring layer preferably has a thickness of 200 nm to 800 nm. Examples of materials for the wiring layer include aluminum and its alloys. Specific examples of the alloys are AlCu, AlSi and AlSiCu. In addition, usable is a laminated film of a metal such as Ti, TiN, TiW or W and an aluminum alloy such as AlCu, AlSi or AlSiCu.

Next, a interlayer insulation film is formed on the first wiring layer. This interlayer insulation film is composed, from the first wiring layer side, of a first silicon oxide film having a compressive stress within the film, a silicon nitride film having a compressive stress within the film, a second silicon oxide film having a tensile stress within the film, and a third silicon oxide film having a compressive stress within the film.

The first silicon oxide film is preferably formed by a plasma CVD method using a silicon compound such as TEOS and $O_2$ as materials. The first silicon oxide film preferably has a thickness of 80 nm to 200 nm. The film formed by the above method has a compressive stress of around 3E8 dyn/cm$^2$ to around 5E8 dyn/cm$^2$ per unit area, and therefore the film with the above thickness has a compressive stress of 0.24E4 dyn/cm to 1E4 dyn/cm per unit length. As film deposition conditions in the plasma CVD method, may be mentioned a flow rate of the silicon compound of 700 sccm to 900 sccm, a flow rate of $O_2$ gas of 500 sccm to 700 sccm, an RF power of 600 W to 800 W, a pressure of 7 torr to 9 torr and a temperature of 380° C. to 420° C.

The silicon nitride film is preferably formed by the plasma CVD method using a silicon compound such as $SiH_4$ and a nitrogen compound such as $NH_3$ or $N_2$ as materials. The silicon nitride film preferably has a thickness of 100 nm to 200 nm. Since the silicon nitride film is formed after the formation of the first silicon oxide film, the silicon oxide film serves as a buffer film, and therefore even if the silicon nitride film is formed thick, the silicon nitride film is prevented from having cracks or from peeling off. Accordingly, sidewalls of the first wiring layer can be sufficiently covered.

The film formed by this method has a compressive stress of around 1E9 dyn/cm$^2$ to around 2E9 dyn/cm$^2$ per unit area, and therefore the film with the above thickness has a compressive stress of 1E4 dyn/cm to 4E4 dyn/cm per unit length. As film deposition conditions in the plasma CVD method, may be mentioned a flow rate of the silicon compound of 120 sccm to 160 sccm, a flow rate of the nitrogen compounds of 1200 sccm to 1600 sccm, an RF power of 350 W to 500 W, a pressure of 5 torr to 6 torr and a temperature of 340° C. to 380° C.

The second silicon oxide film is preferably formed by an atmospheric CVD method using a silicon compound such as TEOS and $O_3$ as materials. Since the second silicon oxide film is formed on the silicon nitride film, the dependence of the second silicon oxide film on the under layer can be controlled. The film formed by this method has a tensile stress of around 1E9 dyn/cm$^2$ to around 2E9 dyn/cm$^2$ per unit area. The second silicon oxide film preferably has a thickness of 1000 nm to 1800 nm and more preferably 1200 nm to 1700 nm. The film with the above thickness, therefore, has a tensile stress of 1E5 dyn/cm to 3.4E5 dyn/cm per unit length. As film deposition conditions in the atmospheric CVD method, may be mentioned a flow rate of the silicon compound of 2500 sccm to 3500 sccm, a flow rate of $O_3$ gas of 6500 sccm to 8500 sccm and a temperature of 400° C. to 440° C.

Prior to formation of the third silicon oxide film, the second silicon oxide film may be subjected to etch back by, for example, a RIE method. The etch back may reduce the thickness of the second silicon oxide film to around 100 nm to around 200 nm. After the etch back, a silicon oxide film may be laminated on the second silicon oxide film by the same method as employed for the formation of the first silicon oxide film. Methods for performing the etch back are not particularly limited, and a known method such as the RIE method can be employed. The RIE method is a dry etching method utilizing $CHF_3$, $CF_4$, Ar or the like as an etchant. The etch back improves the flatness of the second silicon oxide film. As conditions in the etch back, may be mentioned a flow rate of the etchant of 800 sccm to 1000 sccm, an RF power of 700 W to 800 W and a pressure of 1.5 torr to 2.0 torr.

Further, to remove water from the second silicon oxide film, the second silicon oxide film may be subjected to annealing. The annealing is performed in an atmosphere of an inert gas such as nitrogen at 400° C. to 420° C. for 10 minutes to 30 minutes, for example.

The third silicon oxide film is formed on the second silicon oxide film. The third silicon oxide film is preferably formed by the plasma CVD method using a silicon compound such as TEOS and $O_2$ as materials. The third silicon oxide film preferably has a thickness of 200 nm to 300 nm. The film formed by this method has a compressive stress of around 3E8 dyn/cm$^2$ to around 5E8 dyn/cm$^2$ per unit area, and therefore the film with the above thickness has a compressive stress of 0.6E4 dyn/cm to 2E4 dyn/cm per unit length. As film deposition conditions in the plasma CVD method, may be mentioned a flow rate of the silicon compound of 700 sccm to 900 sccm, a flow rate of the $O_2$ gas of 500 sccm to 700 sccm, an RF power of 600 W to 800 W, a pressure of 7 torr to 9 torr, and a temperature of 380° C. to 420° C.

A second wiring layer is formed on the interlayer insulation film obtained by the above-mentioned methods. The second wiring layer preferably has a thickness of 200 nm to 1000 nm. Examples of materials for the second wiring layer include aluminum and its alloys. Specific examples of the alloys are AlCu, AlSi and AlSiCu. In addition, as the second wiring layer, usable is a laminated film of a metal as Ti, TiN, TiW or W and aluminum alloys such as AlCu, AlSi or AlSiCu.

Further, by forming contact holes in the interlayer insulation film to expose the first wiring layer therethrough and then forming the second wiring layer, it is possible to ensure the conduction between the first wiring layer and the second wiring layer.

EXAMPLE

The present invention will now be explained in detail based on the example and the comparative example. It should be understood that the present invention is not limited to the examples.

Example 1

Referring to FIG. 1(a) to FIG. 1(d), an example of the present invention will be explained.

A gate oxide film 12 having a thickness of around 0.01 μm was formed on a semiconductor substrate 11, and thereafter a conductive film (for example, a polysilicon film or tungsten polycide film having impurities diffused at a high concentration) for forming gate electrodes was deposited thereon to a thickness of around 0.2 μm. Next, the conductive film was patterned into gate electrodes 13 through a photolithography process and an etching process. Then, using the gate electrodes as masks, impurity ions were implanted in the semiconductor substrate, thereby forming MOS transistors.

Further, an interlayer insulation layer 14 was deposited to a thickness of around 600 nm so as to cover the semiconductor substrate 11 and the gate electrode 13. As the interlayer insulation layer 14, used was a film formed by depositing a $SiO_2$ film containing boron and phosphorus by a CVD method and flattening it with a reflow process at a temperature of around 850° C. to around 900° C. or a film formed by depositing a $SiO_2$ film not containing impurities by the CVD method and planarizing it by a CMP method.

Next, contact holes, not shown, were formed at desired sites in the interlayer insulation layer 14 by the photolithography process and the etching process in order to achieve conduction between the gate electrodes and a first wiring layer to be formed later. Subsequently, a laminated film of Ti, TiN, AlCu and Ti in this order was deposited on the interlayer insulation layer 14 by a sputtering method. In the laminated film, the Ti, TiN, AlCu and Ti films had thicknesses of 50 nm, 100 nm, 400 nm and 100 nm, respectively. The laminated film was subjected to the photolithography process and the etching process into a first wiring layer 15 with a desired configuration (see FIG. 1(a)).

Next, a first silicon oxide film 16 was formed by a plasma CVD method to cover the first wiring layer 15 and the interlayer insulation layer 14. The film deposition conditions in the plasma CVD method were flow rates of $N_2$ bubbling gas in TEOS of 550 sccm and $O_2$ gas of 550 sccm, an RF power of 250 W, a pressure of 9 torr and a temperature of 390° C.

The first silicon oxide film 16 formed under the above conditions had a compressive stress of around 3E8 dyn/cm² to around 5E8 dyn/cm² per unit area, and therefore it had a compressive stress of 0.3E4 dyn/cm to 0.5E4 dyn/cm per unit length. The first silicon oxide film 16, whose compressive stress was about one tenth of that of a silicon nitride film 17 which was to be formed subsequently, was able to prevent exfoliation and cracks which otherwise would have occurred at the lamination of the silicon nitride film.

Then, the silicon nitride film 17 with a thickness of 100 nm was formed on the first silicon oxide film 16 by the plasma CVD method. The film deposition conditions in the plasma CVD method were flow rates of $SiH_4$ gas of 140 sccm and $NH_3$ gas of 50 sccm, $N_2$ gas of 1400 sccm, an RF power of 420 W, a pressure of 5.5 torr and a temperature of 360° C.

The silicon nitride film 17 formed under the above conditions had a compressive stress of around 1E9 dyn/cm² to around 2E9 dyn/cm² per unit area, and therefore 1E4 dyn/cm to 2E4 dyn/cm per unit length. Even with the above-mentioned thickness, the silicon oxide film 17 was free from exfoliation and cracks. Thus, it became possible to prevent water contained in the second silicon oxide film from diffusing through the silicon nitride film 17.

Figure 1B:
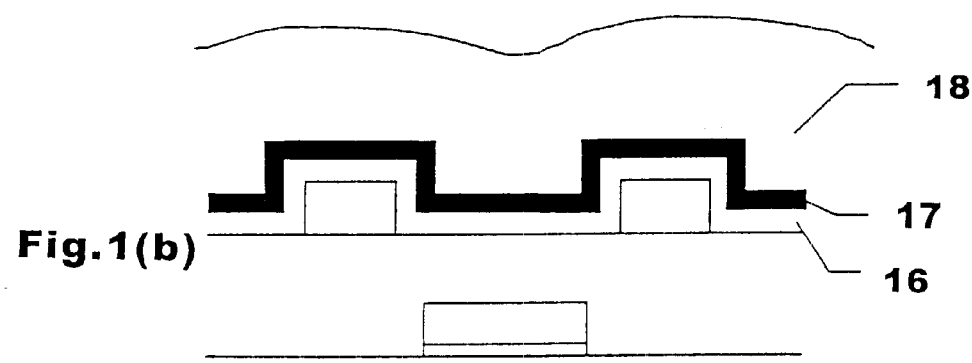

Then, a second silicon oxide film 18 with a thickness of around 1500 nm was formed on the silicon nitride film 17 by an atmospheric CVD method using TEOS and ozone as materials (see FIG. 1(b)). The film deposition conditions in the atmospheric CVD method were flow rates of $N_2$ bubbling gas in TEOS of 3 L/minutes and $N_2$ gas of 18 L/minutes, a flow rate of $O_3$ gas of 7.5 L/minutes and a temperature of 420° C.

The second silicon oxide film 18 formed under the above conditions had a tensile stress of around 1E9 dyn/cm² to around 2E9 dyn/cm² per unit area, and therefore it had a tensile stress of 15E4 dyn/cm to 30E4 dyn/cm per unit length.

Next, the second silicon oxide film 18 was subjected to etch back by a RIE method to a thickness of around 500 nm. The silicon oxide film after the etch back is designated by 18a. The conditions in the etch back were flow rates of $CHF_3$ gas of 30 sccm, $CF_4$ gas of 90 sccm and Ar gas of 800 sccm, an RF power of 750 W and a pressure of 1.8 torr. The performance of the etch back flattened steps which had been formed on an upper surface of the second silicon oxide film 18a owing to the first wiring layer and the like.

Then, the silicon oxide film 18a was subjected to annealing in an atmosphere of nitrogen at 420° C. for 20 minutes. The performance of the annealing was able to remove water absorbed in the second silicon oxide film 18a.

Figure 1C:
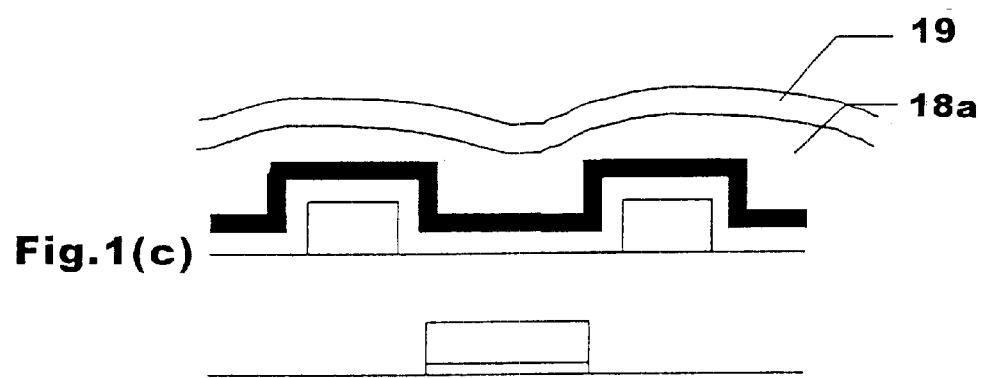
Figure 1D:
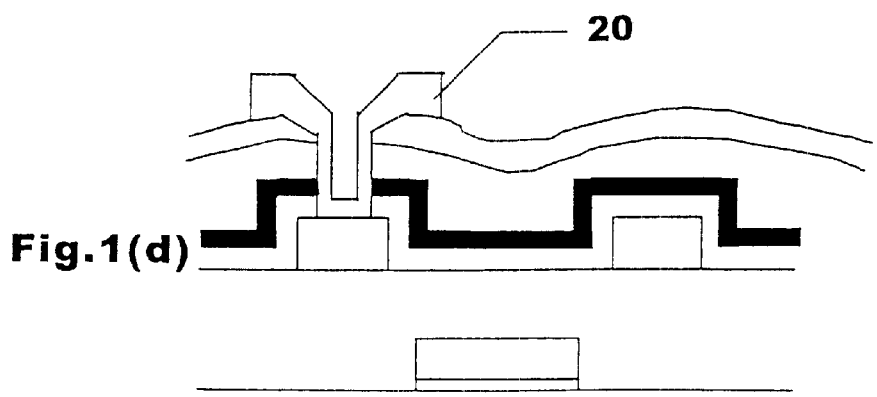
Figure 2A:
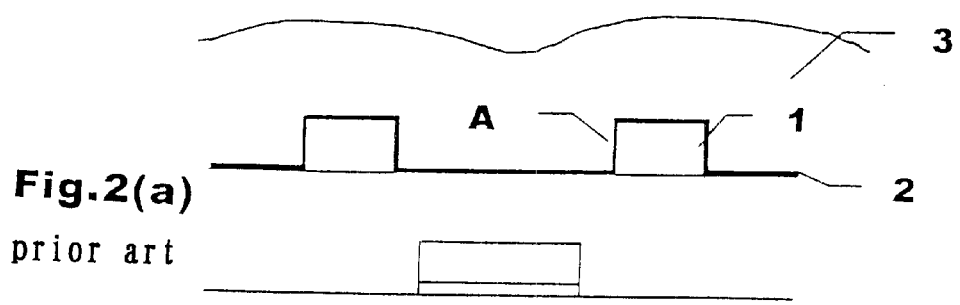
FIGS. 2(*a*) and 2(*b*) are schematic sectional views for explaining problems of a conventional semiconductor device.
Figure 2B:
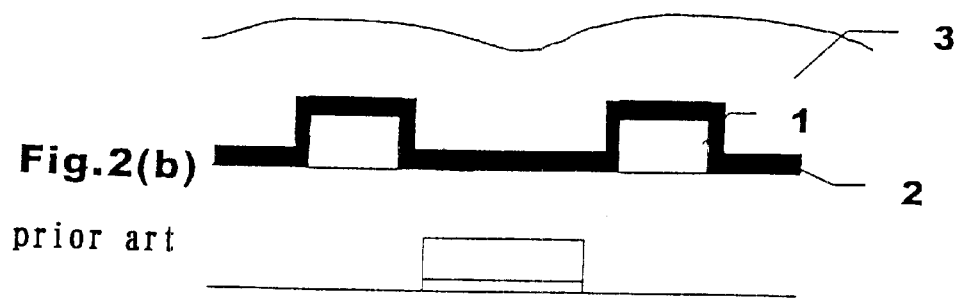

Then, a third silicon oxide film 19 with a thickness of 300 nm was formed on the second silicon oxide film 18a by the plasma CVD method (see FIG. 1(c)). The film deposition conditions in the plasma CVD method were flow rates of $N_2$ bubbling gas in TEOS of 550 sccm and $O_2$ gas of 550 sccm, an RF power of 250 W, a pressure of 9 torr and a temperature of 390° C.

The third silicon oxide film 19 formed under the above conditions had a compressive stress of 3E8 dyn/cm² to 5E8 dyn/cm² per unit area, and therefore it had a compressive stress of 0.9E4 dyn/cm to 1.5E4 dyn/cm per unit length. The provision of the third silicon oxide film 19 more further flattened the steps which had been formed on the upper surface of the second silicon oxide film 18a owing to the first wiring layer and the like. Further, the third silicon oxide film 19 functions to prevent the second silicon oxide film 18a from being over-etched when contact holes were formed to ensure the conduction between the first wiring layer 15 and a second wiring layer 20 to be formed later.

Next, the contact holes for ensuring the conduction between the first wiring layer 15 and the second wiring layer 20 were formed at desired sites in an interlayer insulation film having the first silicon oxide film 16, the silicon nitride film 17, the second silicon oxide film 18a and the third silicon oxide film 19 by the photolithography process and the etching process. Further, a laminated film of Ti, AlCu and TiN in this order was deposited on this interlayer insulation film by the sputtering method. In the laminated film, the Ti, AlCu and TiN film had thicknesses of 100 nm, 800 nm and 50 nm, respectively. The laminated film was subjected to the photolithography process and the etching process so as to form the second wiring layer 20 with a desired configuration (see FIG. 1(d)).

Following the above-mentioned processes, a semiconductor device was fabricated.

Comparative Example 1

A semiconductor device was fabricated in the same manner as in example 1 except that the first silicon oxide film 16 was not formed. The semiconductor device thus obtained suffered exfoliation and cracks occurring in the silicon nitride film.

According to the present invention, the first silicon oxide film underlying the silicon nitride film prevents cracks and exfoliation from occurring in the silicon nitride film even if the silicon nitride film is made thick for ensuring the high reliability of a MOS device. The provision of the silicon nitride film blocks water from intruding from components formed on the silicon nitride film, thereby improving the yield in fabrication of semiconductor devices. Also, the second silicon oxide film can be formed to have a uniform and flattened surface without being dependent on an under layer. Therefore, it has become possible to manufacture semiconductor devices with a miniature structure in a good yield.

What is claimed is:

1. A semiconductor device comprising:

a first wiring layer formed on a semiconductor substrate with an insulation film interposed between the semiconductor substrate and the first wiring layer, an interlayer insulation film and a second wiring layer formed over the first wiring layer in this order, wherein the interlayer insulation film comprises, from a first wiring side thereof, a first silicon oxide film having a compressive stress within the film, a silicon nitride film having a compressive stress within the film, a second silicon oxide film having a tensile stress within the film, and a third silicon oxide film having a compressive stress within the film.

2. A semiconductor device as set forth in claim 1, wherein the first silicon oxide film has a thickness of 80 nm to 200 nm and a compressive stress of 0.24E4 dyn/cm to 1E4 dyn/cm within the film.

3. A semiconductor device as set forth in claim 1, wherein the silicon nitride film has a thickness of 100 nm to 200 nm and a compressive stress of 1E4 dyn/cm to 4E4 dyn/cm within the film.

4. A semiconductor device as set forth in claim 1, wherein the second silicon oxide film has a thickness of 1000 nm to 1800 nm and a tensile stress of 1E5 dyn/cm to 3.4E5 dyn/cm within the film.

5. A semiconductor device as set forth in claim 1, wherein the third silicon oxide film has a thickness of 200 nm to 300 nm and a compressive stress of 0.6E4 dyn/cm to 2E4 dyn/cm within the film.

* * * * *